US012519034B2

(12) United States Patent
Refai-Ahmed et al.

(10) Patent No.: US 12,519,034 B2
(45) Date of Patent: Jan. 6, 2026

(54) THERMAL MANAGEMENT SYSTEM FOR ELECTRONIC DEVICE

(71) Applicant: Advanced Micro Devices, Inc., Santa Clara, CA (US)

(72) Inventors: Gamal Refai-Ahmed, Santa Clara, CA (US); Chi-Yi Chao, New Taipei (TW); Md Malekkul Islam, San Jose, CA (US); Suresh Ramalingam, Fremont, CA (US); Paul Theodore Artman, Orlando, FL (US); Mark Steinke, Austin, TX (US); Christopher Jaggers, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 401 days.

(21) Appl. No.: 18/113,585

(22) Filed: Feb. 23, 2023

(65) Prior Publication Data

US 2024/0290686 A1 Aug. 29, 2024

(51) Int. Cl.

| | |
|---|---|
| ***H01L 23/427*** | (2006.01) |
| ***H01L 23/367*** | (2006.01) |
| ***H01L 23/373*** | (2006.01) |
| ***H01L 23/46*** | (2006.01) |

(52) U.S. Cl.
CPC .......... *H01L 23/427* (2013.01); *H01L 23/367* (2013.01); *H01L 23/3732* (2013.01); *H01L 23/46* (2013.01)

(58) Field of Classification Search
CPC . H01L 23/427; H01L 23/367; H01L 23/3732; H01L 23/46
See application file for complete search history.

(56) References Cited

U.S. PATENT DOCUMENTS

| | | | | |
|---|---|---|---|---|
| 11,373,929 | B1 | 6/2022 | Refai-Ahmed et al. | |
| 2007/0272392 | A1* | 11/2007 | Ghosh | H01L 23/4336 257/714 |
| 2009/0140417 | A1* | 6/2009 | Refai-Ahmed | H01L 23/427 257/707 |
| 2014/0307388 | A1* | 10/2014 | Chiu | H05K 7/20254 165/104.33 |
| 2017/0115071 | A1* | 4/2017 | Lin | F28D 15/0275 |
| 2021/0410329 | A1* | 12/2021 | Yang | H05K 7/20254 |

* cited by examiner

*Primary Examiner* — Peniel M Gumedzoe
(74) *Attorney, Agent, or Firm* — Patterson + Sheridan, LLP

(57) ABSTRACT

A heat exchanger for a chip package is provided. The heat exchanger includes a body having an upper side, a lower side, and an internal cavity disposed in the body between the upper side and the lower side. A first outlet port and a second outlet port are formed in the body and are in fluid communication with the internal cavity. An inlet port is formed through the upper side of the body between the first and second outlet ports to supply fluid into the internal cavity.

20 Claims, 16 Drawing Sheets

THERMAL MANAGEMENT SYSTEM FOR ELECTRONIC DEVICE

TECHNICAL FIELD

Embodiments of the present invention generally relate to a thermal management system and electronic devices having the same, and more particularly, to a thermal management system having an active cooling device equipped with multiple flow ports.

BACKGROUND

Electronic devices often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices. These electronic devices containing one or more chip packages are frequently utilized in advanced electronic computing systems, such as found in telecomm and datacomm equipment, data centers and automotive electronics, among others.

In many chip package assemblies, providing adequate thermal management has become increasingly challenging. Failure to provide adequate cooling often results in diminished service life and even device failure. Thermal management is particularly problematic in applications in which air cooling is not sufficient to maintain safe operational temperatures. In such applications, liquid cooling is utilized to control the temperature of the IC dies. In typical cross flow heat exchangers, the liquid coolant moves in single path from the inlet to the outlet. In these systems, the inlet region has a highest temperature differential to drive heat transfer.

There is a need for an electronic device having improved thermal management.

SUMMARY

In one embodiment, a heat exchanger for a chip package is provided. The heat exchanger includes a body having an upper side, a lower side, and an internal cavity disposed in the body between the upper side and the lower side. A first outlet port and a second outlet port are formed in the body and are in fluid communication with the internal cavity. An inlet port is formed through the upper side of the body between the first and second outlet ports to supply fluid into the internal cavity. In some embodiments, the heat exchanger also includes a pad extending from the lower side of the body below the inlet port.

A chip package includes a substrate, an integrated circuit ("IC") die mounted on the substrate, and a heat exchanger disposed over the IC die. The heat exchanger includes a body having an upper side, a lower side, and an internal cavity disposed in the body between the upper side and the lower side. The lower side faces a top surface of the IC die. The heat exchanger also includes a first outlet port and a second outlet port formed in the body, both of which are in fluid communication with the internal cavity. A first outlet port is formed in the body and in fluid communication with the internal cavity. The heat exchanger further includes a thermal interface material disposed between the lower side of the heat exchanger and the top surface of the IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

In FIG. 8, the cap is separated from the base of the active cooling device.

In FIG. 10, the cap is separated from the base of the active cooling device.

Figure 1:
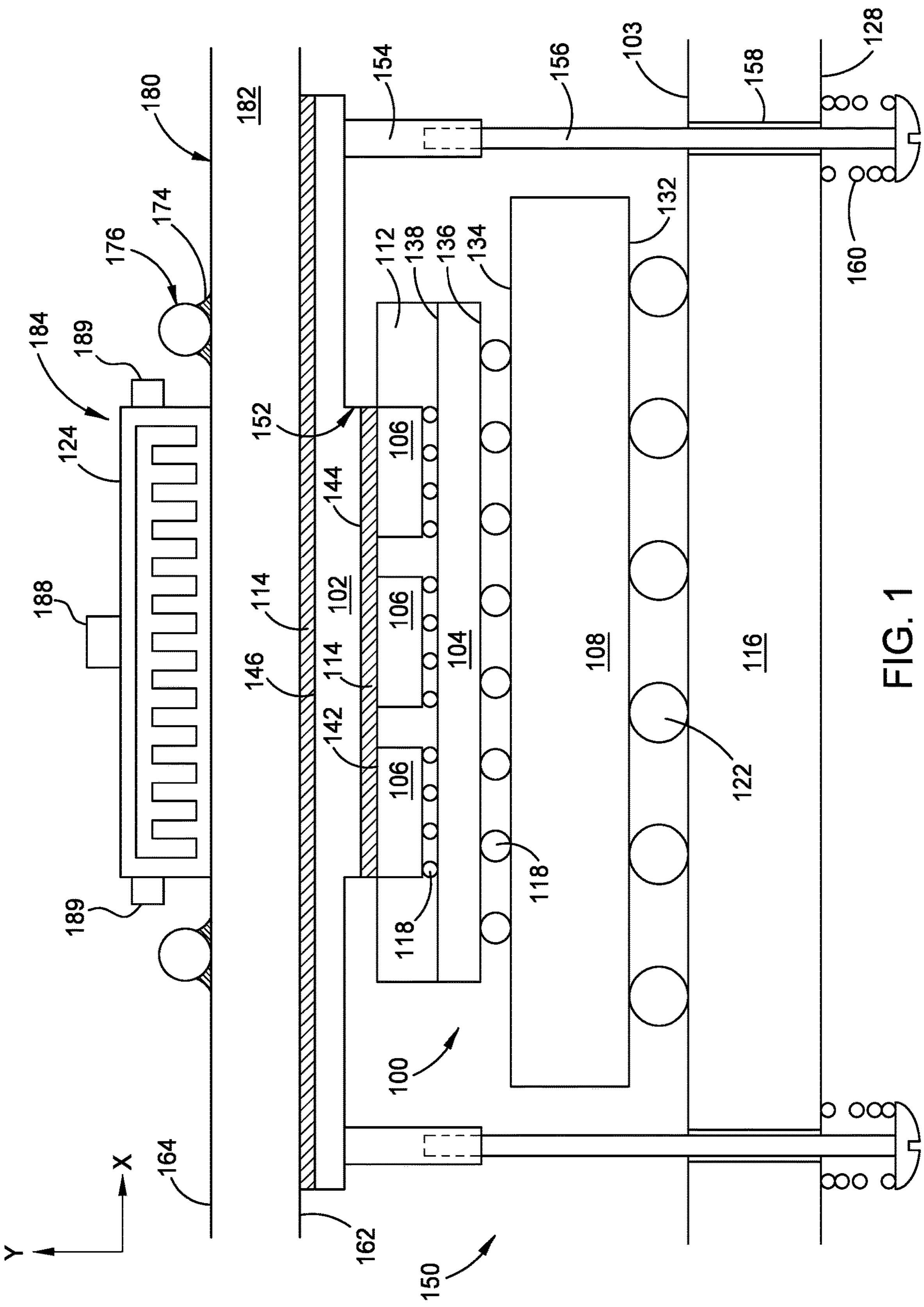
FIG. 1 is a partial schematic sectional view of an electronic device having a chip package assembly interfaced with an active cooling device, according to some embodiments.

To facilitate understanding, identical reference numerals have been used, where possible, to designate identical elements that are common to the figures. It is contemplated that elements of one embodiment may be beneficially incorporated in other embodiments. Additionally, the adjectives top and bottom are provided for ease of explanation, and may be utilized to desired surfaces that alternatively may have a vertical orientation.

DETAILED DESCRIPTION

In some embodiments, a heat exchanger for a chip package is provided. The heat exchanger includes a body having an upper side, a lower side, and an internal cavity disposed in the body between the upper side and the lower side. A first outlet port and a second outlet port are formed in the body and are in fluid communication with the internal cavity. An inlet port formed through the upper side of the body between the first and second outlet ports to supply fluid into the internal cavity. The inlet port 348 advantageously allows quick distribution of the heat transfer fluid across a region of the internal cavity. Also, the working fluid can flow in different paths to a plurality outlet ports, thereby increasing heat transfer efficiency.

FIG. 1 illustrates a schematic partial sectional view of an electronic device 150 having a cooling plate assembly 180 interfaced with at least one chip package assembly 100, according to some embodiments. The cooling plate assembly 180 functions as the primary global-level heat spreader plate of the electronic device 150. An active cooling device 184 having multiple flow ports is disposed on the cooling plate assembly 180. As shown, the active cooling device 184 includes an inlet port 188 disposed at the top and two outlet ports 189 disposed on the sides. A heat spreader 102 may optionally be disposed between the cooling plate assembly 180 and the chip package assembly 100. The heat spreader 102 functions as a local-level heat spreader relative to the function of the cooling plate assembly 180. The at least one chip package assembly 100 is mounted to a printed circuit board 116. Although only one chip package assembly 100 is shown mounted to the printed circuit board 116 in FIG. 1, more than one chip package assembly 100 may be mounted to the printed circuit board 116. For example, up to as many chip package assemblies 100 as can fit on the printed circuit board 116 may be utilized.

The illustrative chip package assembly 100 also includes one or more integrated circuit (IC) dies 106, an interposer 104 and a package substrate 108. In the example illustrated in FIG. 1, the one or more integrated circuit dies 106 are mounted to the interposer 104, while the interposer 104 is mounted to the package substrate 108. In turn, the package substrate 108 of the chip package assembly 100 is mounted to the PCB 116. Optionally, the one or more integrated circuit dies 106 may be directly mounted to the package substrate 108 without use of an interposer.

Although three IC dies 106 are shown in FIG. 1, the total number of IC dies may range from one to as many as can be fit within the chip package assembly 100. Examples of IC dies 106 that may be utilized in the chip package assembly 100 include, but are not limited to, logic and memory devices, such as field programmable gate arrays (FPGA), application-specific integrated circuits (ASICs), memory devices, such as high band-width memory (HBM), optical devices, processors or other IC logic or memory structures. One or more of the IC dies 106 may optionally include optical devices such as photo-detectors, lasers, optical sources, and the like.

Dielectric filler 112 is disposed on the interposer 104 and at least partially laterally circumscribes the dies 106. The dielectric filler 112 may also encapsulate the dies 106 against the interposer 104. The dielectric filler 112 provides additional rigidity to the chip package assembly 100, while also protecting the solder connections 118 between the IC dies 106 and the interposer 104. The dielectric filler 112 may be an epoxy-based material or other suitable material. The dielectric filler 112 may additionally include fillers, for example, inorganic fillers such as silica ($SiO_2$).

Functional circuitry of the IC dies 106 is connected to the circuitry of the interposer 104 through the solder connections 118 or other suitable electrical connection, such as a hybrid bond comprised of metal circuit connection material disposed in a dielectric material. The circuitry of the interposer 104 is similarly connected to the circuitry of the package substrate 108. In the example depicted in FIG. 1, a bottom surface 136 of the interposer 104 is electrically and mechanically coupled to a top surface 134 of the package substrate 108 by solder connections 118 or other suitable electrical connection, such as a hybrid bond. Additionally, the circuitry of the package substrate 108 is coupled to the circuitry of the PCB 116 via solder balls 122 when the chip package assembly 100 is mounted to the PCB 116 to form the electronic device 150.

The top surface 142 of the upper most die 106 faces a bottom surface 144 of the heat spreader 102. The heat spreader 102 is fabricated from rigid thermally conductive material. Materials suitable for fabricating the heat spreader 102 include stainless steel, copper, nickel-plated copper and aluminum, among other suitable thermally conductive materials. The heat spreader 102 enhances local-level heat transfer to the cooling plate assembly 180.

Thermal interface material (TIM) 114 may be disposed between the top surface 142 of the IC die 106 and the bottom surface 144 of the heat spreader 102 to enhance heat transfer therebetween. In one example, the TIM 114 may be a thermally conductive grease, thermal gel or thermal epoxy, such as, packaging component attach adhesives. Optionally, the TIM 114 may a plurality of thermally conductive particles dispersed in a carrier material. The carrier material may be comprised of the thermally conductive grease, thermal gel or thermal epoxy. The thermally conductive particles may include one or more of metal, carbon or other highly thermally conductive particles, metal fibers, metal powder, metal balls, fillers or additives that enhance the heat transfer of the carrier material of the TIM 114. The thermally conductive particles, when utilized, may be up to and even greater than 90% of the TIM 114 by weight. The thermally conductive particles may have a particle size of up to about 25 μm.

The heat spreader 102 may be structurally coupled to the package substrate 108 or PCB 116 to increase the rigidity of the chip package assembly 100. Optionally, the heat spreader 102 may be dynamically mounted to the PCB 116 in a manner that allows relative movement between the heat spreader 102 to the underlying chip package assembly 100. Allowing relative movement reduces stress within the chip package assembly 100, which in turn increases the reliability and effectiveness of the solder connections 118.

In the example depicted in FIG. 1, the bottom surface 144 of the heat spreader 102 includes a threaded boss 154. The threaded boss 154 accepts a fastener 156 that extends through a through hole 158 formed in the PCB 116. A spring 160 is disposed between a head of the fastener 156 and a bottom surface 128 of the PCB 116. The spring 160 applies a force on the fastener 156 that is aligned in an axial direction of the fastener 156, which in turn causes the heat spreader 102 to be pulled toward the PCB 116. The force on the heat spreader 102 also causes the heat spreader 102 to be urged against the IC dies 106 of the chip package assembly 100, which is sandwiched between the heat spreader 102 and an upper surface 103 of the PCB 116. The bottom surface 144 of the heat spreader 102 may also include a pad 152 projecting from the bottom surface 144 that makes contact with the IC dies 106 through the TIM 114. Although shown as being planar, the pad 152 may include steps so that different portions of the pad 152 extend different distances from the bottom surface 144 of the heat spreader 102, thus allowing different heights of the IC dies 106 to be accommodated while maintaining good thermal contact with the heat spreader 102.

Optionally, the bottom surface 144 of the heat spreader 102 may include a patterned surface. In one embodiment, the patterned surface is formed on the pad 152. The patterned surface may be comprised of dimples, projections, blind holes, slots, channels and the like which increase the surface area of the bottom surface 144 in contact with the TIM 114, which increases the heat transfer efficiency. The patterned surface, in one example, is comprised of a pattern of micro-channels formed in the bottom surface 144 of the heat spreader 102. The patterned surface may be formed in the bottom surface 144 via etching, embossing, or any other suitable technique. For some examples, the patterned surface may be in the form of micro-channels arranged in rows, in columns, as positive-sloping diagonals, as negative-sloping diagonals, or as a combination thereof. In one example, the features (i.e., micro-channels, protrusions, etc.) forming the patterned surface may have a plus or minus elevation of, but not limited to, 0.1 mm to 0.2 mm relative to the general plane of the bottom surface 144.

The cooling plate assembly 180 is mounted above a top surface 146 of the heat spreader 102. The cooling plate assembly 180 is in good thermal contact directly with or through TIM 114 with the top surface 146 of the heat spreader 102. The cooling plate assembly 180 provides an efficient heat transfer path away from one or more chip package assemblies 100, thus providing robust thermal management of the IC dies 106 within the electronic device 150.

The cooling plate assembly 180 generally includes a cooling plate 182, one or more optional passive cooling devices 176 and one or more active cooling devices 184. Optionally, the active cooling devices 184 may be utilized with or without the passive cooling devices 176. As utilized herein, an active cooling device is a heat transfer structure or system that utilizing an open or circulated fluid circuit for transfer heat, examples of which include heat exchangers and fan forced air systems. Active cooling devices may also incorporate passive cooling elements such as a passive fluid element (i.e., a heat pipe) with active air cooling (i.e., fan driven air) and/or active liquid cooling (i.e., a heat exchanger interfaced with the passive cooling elements). In contrast, a passive cooling device is fluidless or has fluid trapped in a sealed volume for heat transfer, examples of which include heat sinks and heat pipes. Passive cooling device may also include passive fluid (i.e., fluid that is not mechanically, electrically or otherwise driven) disposed around heat sinks and heat pipes, thus allowing bouncy natural capillary force or convection to be the dominating flow movement of the passive fluid.

The cooling plate 182 has a top surface 164 and a bottom surface 162. The cooling plate 182 is fabricated from rigid thermally conductive material. Materials suitable for fabricating the cooling plate 182 include stainless steel, copper, nickel-plated copper and aluminum, among other suitable thermally conductive materials. In the example depicted in FIG. 1, the cooling plate 182 is fabricated from aluminum. Although the lateral planar area of the cooling plate 182 is not illustrated in FIG. 1, the planar area of the cooling plate 182 is larger, for example as much as 2, 4 or even 10 times or more larger than the planar area of the chip package assembly 100.

As mentioned above, the passive and active cooling devices 176, 184 are mounted in or on the top surface 164 of the cooling plate 182. For example, the one or more passive devices 176 may be soldered, adhered, brazed, clamped, fastened or otherwise affixed in good thermal contact with the top surface 164 of the cooling plate 182. In one example, the one or more passive devices 176 is affixed by a thermally conductive material 174 to the top surface 164 of the cooling plate 182. The thermally conductive material 174 may be solder, TIM or other suitable thermally conductive material. In one example, the passive device 176 is a heat pipe.

The one or more active cooling devices 184 are mounted in or on the top surface 164 of the cooling plate 182. For example, the one or more active cooling devices 184 may be soldered, adhered, brazed, clamped, fastened or otherwise affixed in good thermal contact with the top surface 164 of the cooling plate 182. In one example, the one or more active cooling devices 184 is affixed by solder to the top surface 164 of the cooling plate 182.

The passive cooling devices 176 generally route heat to different portions of the cooling plate 182, while the active cooling devices 184 remove heat from the cooling plate 182. Accordingly, the cooling plate assembly 180 effectively removes heat from the chip package assemblies 100 utilizing predetermined placement of the passive cooling devices 176 and active cooling devices 184 relative to location of the heat sources (i.e., IC dies 106) within the chip package assemblies 100 and the electronic device 150.

Figure 2:
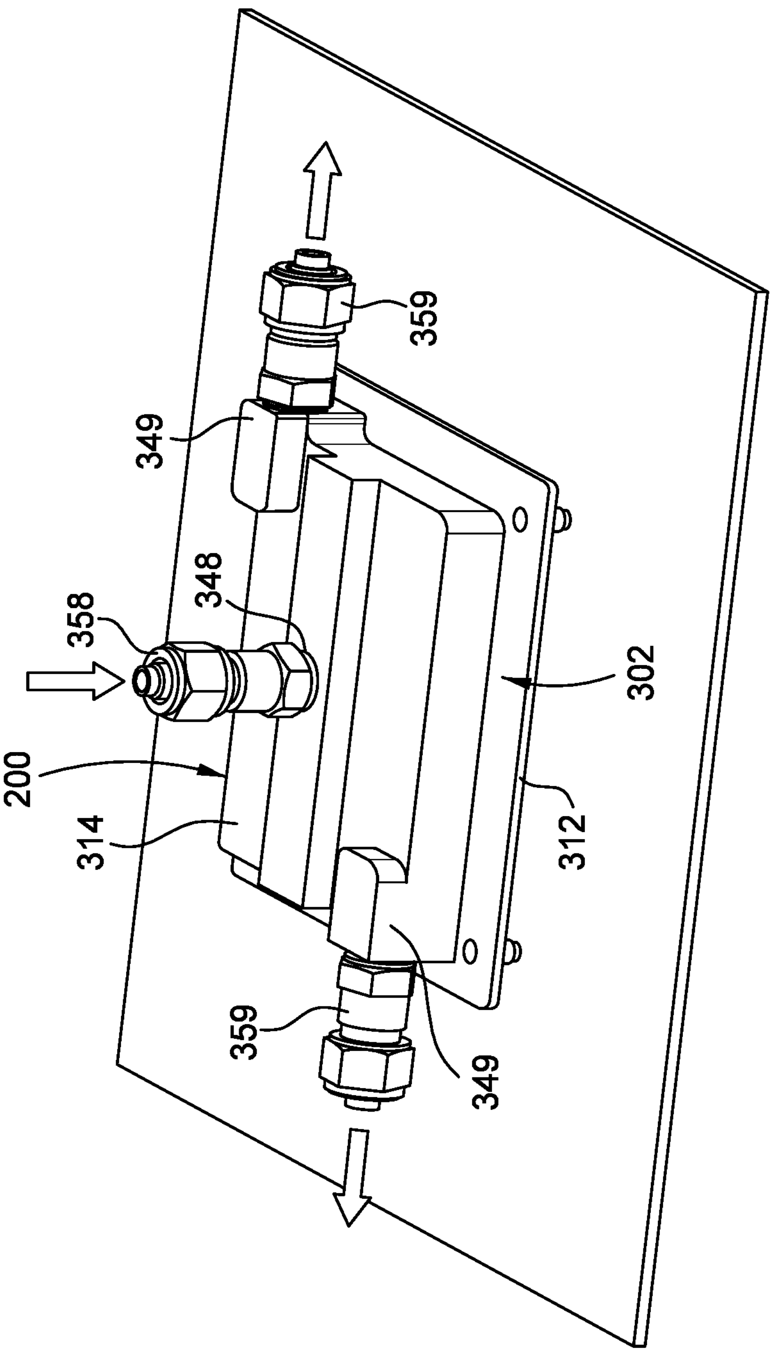
FIG. 2 illustrates an exemplary active cooling device having multiple flow ports, according to some embodiments.
Figure 3A:
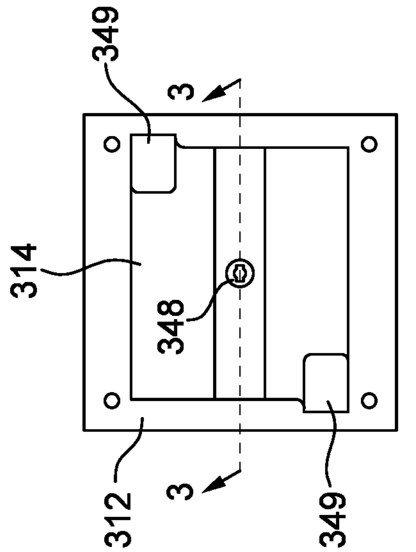
FIG. 3A is a schematic top view of the active cooling device of FIG. 2.
Figure 3:
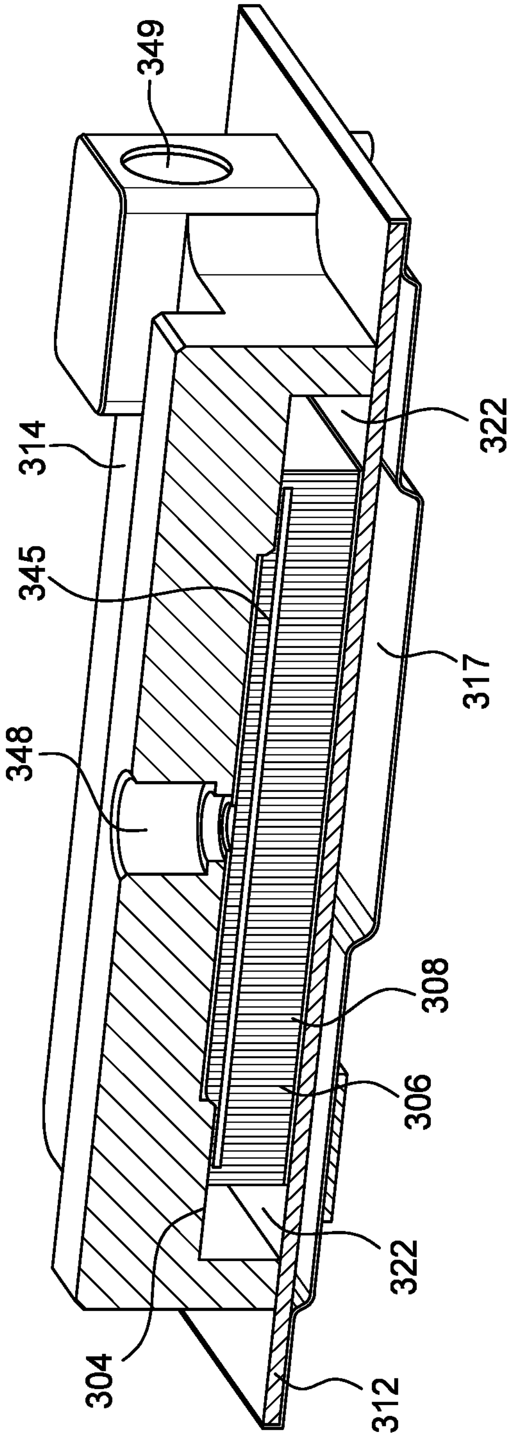
FIG. 3 is a sectional view of the active cooling device of FIG. 2.
Figure 4A:
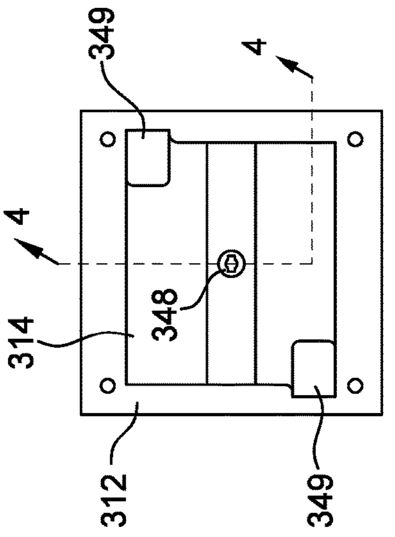
FIG. 4A is a schematic top view of the active cooling device of FIG. 2.
Figure 4:
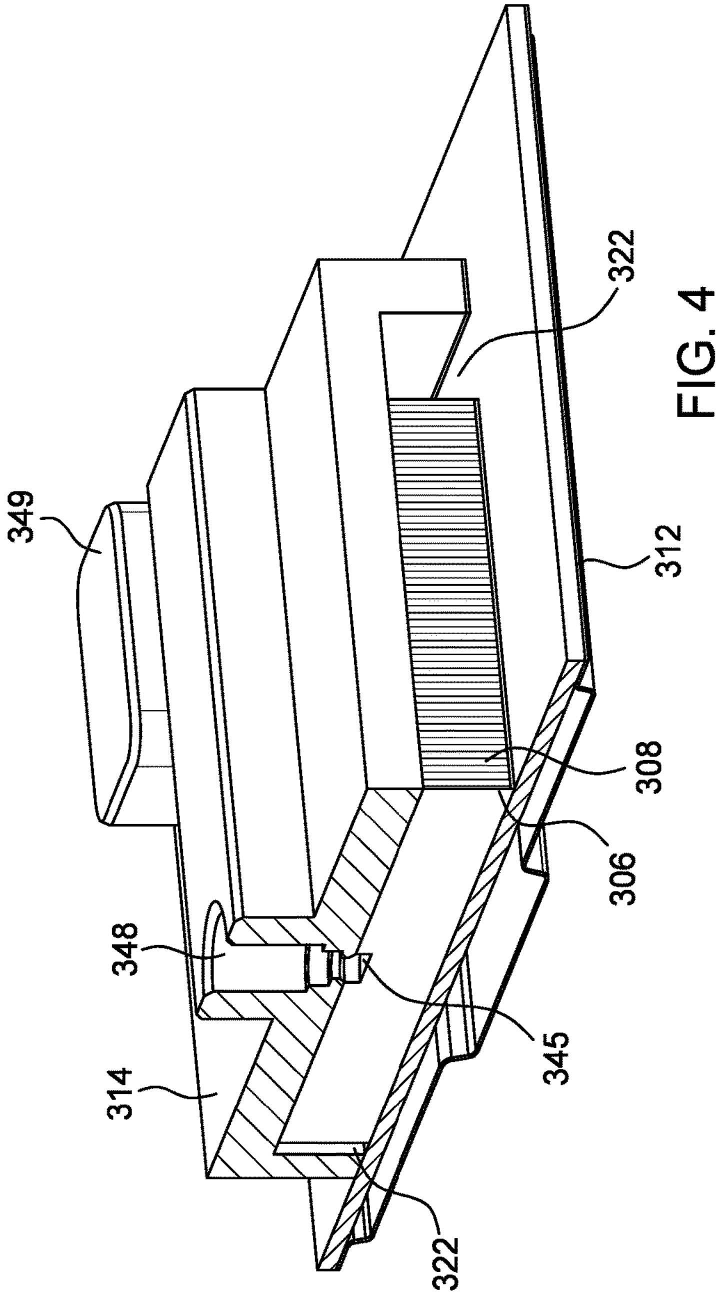
FIG. 4 is another sectional view of the active cooling device of FIG. 2.

FIG. 2 illustrates an exemplary embodiment of an active cooling device 200 having multiple flow ports, according to some embodiments. FIGS. 3 and 4 are different sectional views of the active cooling device 200 of FIG. 2. FIGS. 3A and 4A are top views of the active cooling device of FIG. 2. The active cooling device 200 may be the active cooling device 184 shown in FIG. 1. In some embodiments, the active cooling device 200 forms a part of the cooling plate assembly 100 of FIG. 1.

In one embodiment, the active cooling device 200 generally includes a body 302 having an internal cavity 304 in which a plurality of surface area increasing structures, such as fins 306, are disposed. The active cooling device 200 also includes multiple flow ports for fluid communication with the internal cavity 304. The fins 306 create channels 308 within the internal cavity 304 through which the working fluid is flowed.

In one example, the body 302 has a lower side such as a base 312 and an upper side such as a cap 314. The cap 314 is coupled to the base 312 to sealingly enclose the internal cavity 304. The cap 314 may be sealingly coupled to the base 312 by brazing or other suitable technique. The base 312 and the cap 314 are generally fabricated from a highly thermally conductive material that is compatible with the working fluids. In one example, the base 312 and the cap 314 are generally fabricated from or covered with copper. The base 312 may be attached to the top surface of the cooling plate 180. In some embodiments, the base 312 is integrated with the cooling plate 180. The base 312 may optionally include a vapor chamber 317.

As shown in FIGS. 2-4, an inlet port 348 is formed through the top of the cap 314 for suppling working fluid into the internal cavity 304. At least one outlet port 349 is formed on the side of the body 302 for relieving working fluid from the internal cavity 304. In this example, two outlet ports 349 are disposed at opposite sides of the cap 314. FIG. 2 shows the inlet port 348 and the outlet ports 349 provided with fittings 358, 359 to facilitate attachment to a respective supply line or drainage line. In some embodiments, the inlet port 348 is located in a central region of the cap 314. For example, the central region can be centered with respect to the center of the internal cavity and having an area that is 0.05× to 0.5× the area of the internal cavity 304 in the x-z plane. In some embodiments, the central region may be bounded by a circle having a radius that is 0.4×, 0.3×, 0.2×, or 0.1× the length of the x dimension of the internal cavity 304. It is contemplated one or more inlet ports 348 may be located at any suitable location of the cap 414, including outside of the central region. The inlet port 348 may have any suitable shape, such as round, oval, or rectangular. The inlet port 348 advantageously allows quick distribution of the working fluid, e.g., heat transfer fluid, across a region of the internal cavity 304. Also, the working fluid can flow in different paths to a plurality outlet ports 349, thereby increasing heat transfer efficiency.

In the example depicted in FIGS. 3 and 4, the plurality fins 306 are formed from the base 312 and extend into the internal cavity 304 to define a plurality of channels 308. The fins 306 may be formed by a skiving process or other suitable technique to produce micro-sized channels 308 that increase the surface area of the body 302 available for heat transfer with the working fluid, which enhances the performance of the active cooling device 200. In some embodiments, the fins 306 may be formed from the cap 314 and extend into the internal cavity 304. A flow gap 322 is formed around the perimeter of the plurality of fins 306. In this example, the fins 306 and the channels 308 extend in a direction that is transverse to the flow direction of the outlet flow ports 349. In some embodiments, the fins 306 may have a length from 10 mm to 100 mm or from 20 mm to 70 mm and a height from 2 mm to 10 mm or from 2 mm to 7 mm.

In some embodiments, an optional recessed groove 345 is formed at the top of the plurality of fins 306. In one embodiment, the recessed groove 345 comprises upper notches formed on the upper end of the plurality of fins 306. The recessed groove 345 may be aligned with inlet port 348 to facilitate the distribution of the incoming working fluid to the fins 306. In some embodiments, the recessed groove 345 is a longitudinal groove having a width that is from 0.5× to 3× or from 0.75× to 1.5× the diameter of the inlet port 348. The depth of the recessed groove 345 may be from 0.05× to 0.5× or 0.1× to 0.3× the height of the fins 306. The longitudinal recessed groove 345 may be formed in the fins 306 located in the central region, as discussed above. In some embodiments, the recessed groove 345 is formed in all of the fins 306 or all of the fins 306 except for the last one, two, three, four, five, or six fins 306 at either end. In some embodiments, the recessed groove 345 has a circular shape, the center of which may be aligned with the inlet port 348.

Figure 5:
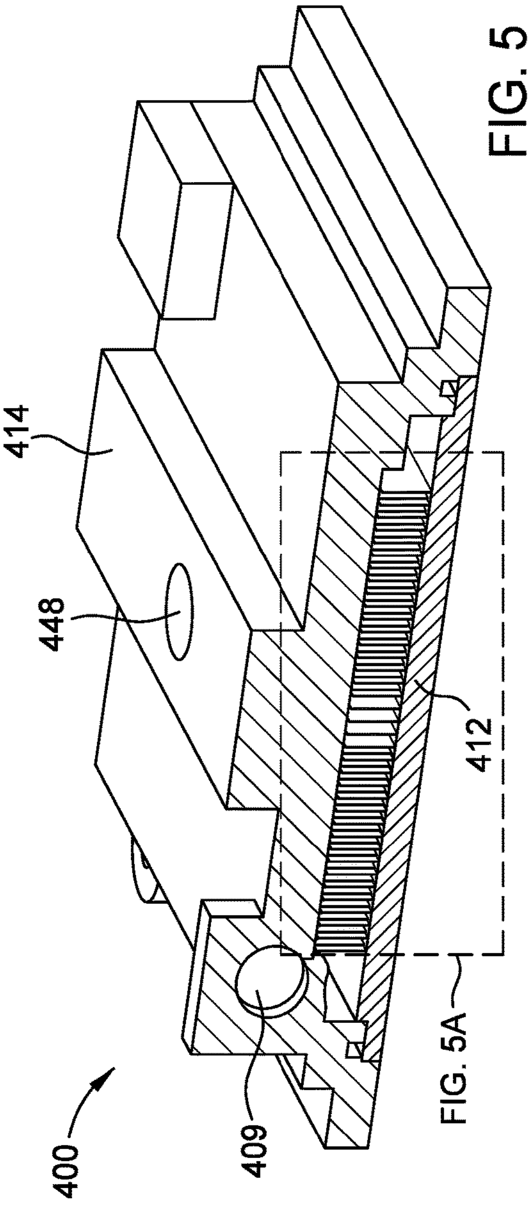
FIG. 5 illustrates a sectional view of an active cooling device equipped with another embodiment of surface area increasing structures.
Figure 5A:
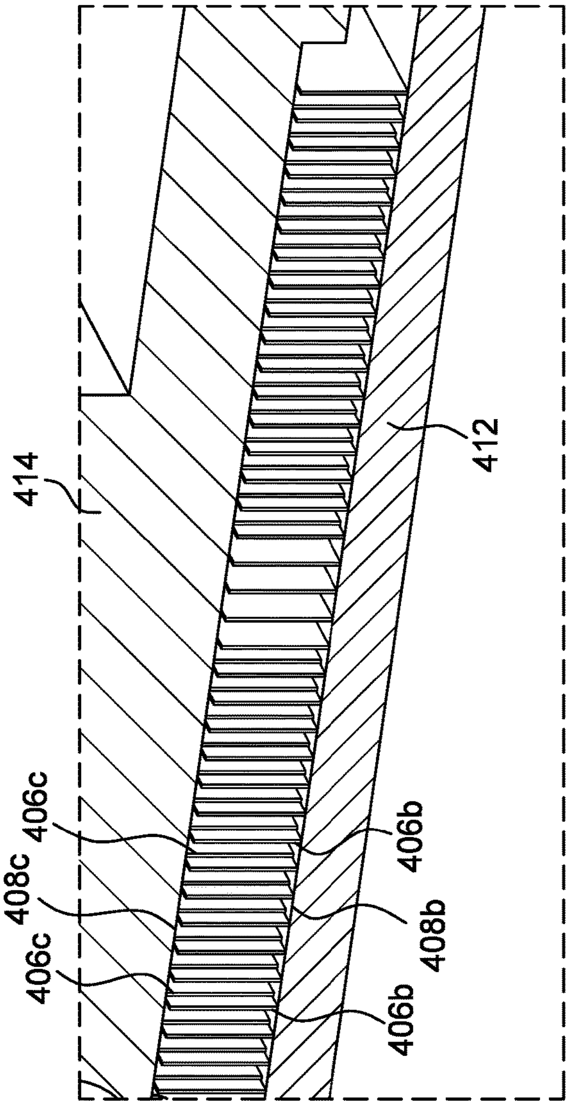
FIG. 5A is an enlarged partial view of FIG. 5.
Figure 5B:
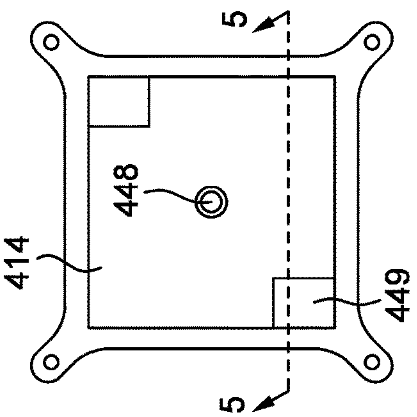
FIG. 5B is a schematic top view of the active cooling device of FIG. 5.

FIG. 5 illustrates a sectional view of an active cooling device 400 equipped with another embodiment of surface area increasing structures. FIG. 5A is an enlarged partial view of FIG. 5. As shown, the surface area increasing structures include a plurality of base fins **406*b* formed from the base 412 that extend into the internal cavity 404 to define a plurality of base channels 408*b*. The surface area increasing structures also include a plurality of cap fins 406*c* formed from the cap 414 that extend into the internal cavity 404 to define a plurality of cap channels 408*c*. The base fins 406*b* and the cap fins 406*c* are staggered such that the base fins 406*b* extend into the cap channels 408*c* and the cap fins 406*c* extend into the base channels 408*b*. In some embodiments, an upper clearance is formed between the end of the base fin 406*b* and the cap 414. A lower clearance may be formed between the end of the cap fin 406*c* and the base 412. In some embodiments, cap fins 406*c* are not formed below the inlet port 448, as illustrated in FIG. 5A. In this example, the base fins 406*b* and the cap fins 406*c* extend along the same direction as the outlet ports 449. In another example, the fins 406*b*, 406*c* may extend along a transverse direction as the outlet ports 449**.

Figure 6:
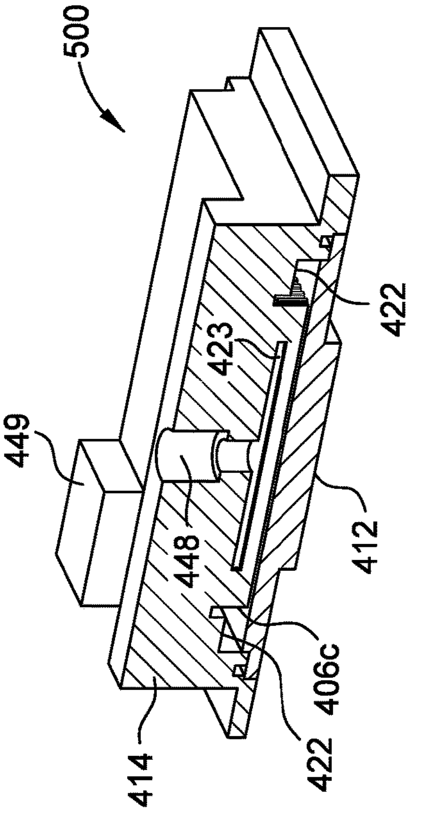
FIG. 6 illustrates a sectional view of an active cooling device equipped with another embodiment of surface area increasing structures.
Figure 6A:
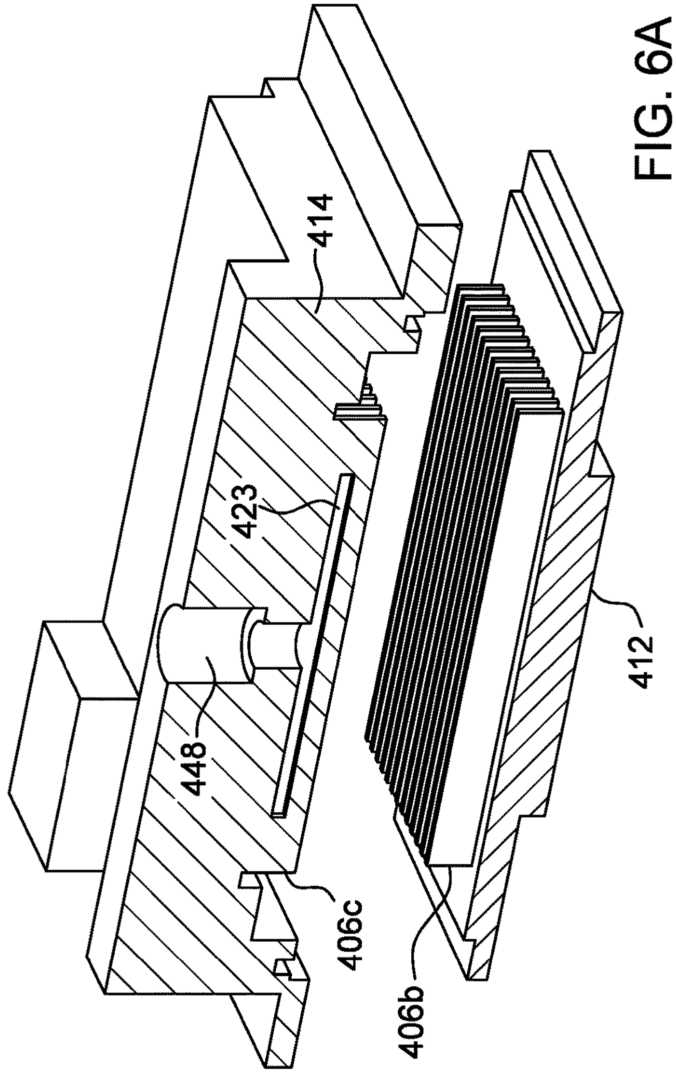
FIG. 6A shows the cap separated from the base of the active cooling device of FIG. 6.
Figure 6B:
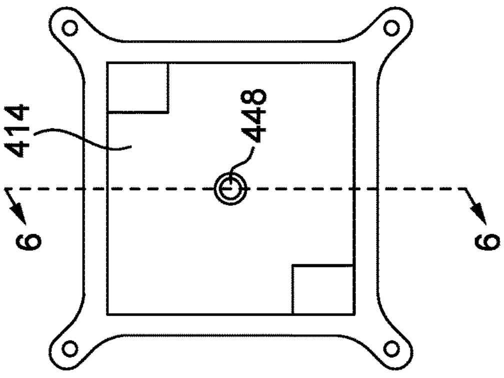
FIG. 6B is a schematic top view of the active cooling device of FIG. 6.

In some embodiments, an aperture may be formed in at least one of the cap fins **406*c* and the base fins 406*b*. FIG. 6 illustrates a sectional view of an active cooling device 500 equipped with another embodiment of surface area increasing structures. FIG. 6A shows the cap 412 separated from the base 414 of the active cooling device 500 of FIG. 6. As shown in FIG. 6, a plurality of apertures in the shape of slots 423 are formed in the cap fins 406*c*. In some embodiments, at least a portion of the slots 423 is located above the top of the base fins 406*b*. In one example, the slots 423 may have a length from 0.2× to 0.85× the length of the cap fins 406*c* and a height from 0.1× to 0.5× the height of the cap fins 406*c*. One or more slots 423 may be formed in all or some of the cap fins 406*c*. For example, the slots 423 may be formed in every other cap fin 406*c* or formed in the cap fins 406*c* located below or adjacent to the inlet port 414. In some embodiments, one or more of the cap fins 406*c* may include more than one slot 423. For example, two or more smaller sized slots 423 may be formed in a cap fin 406*c*. It is contemplated the slots may be formed in the base fins 406, alternatively or in addition, to the slots 423 in the cap fins 406*c*. The flow gaps 422 can be seen at the end of the base fins 406*b***.

Figure 7:
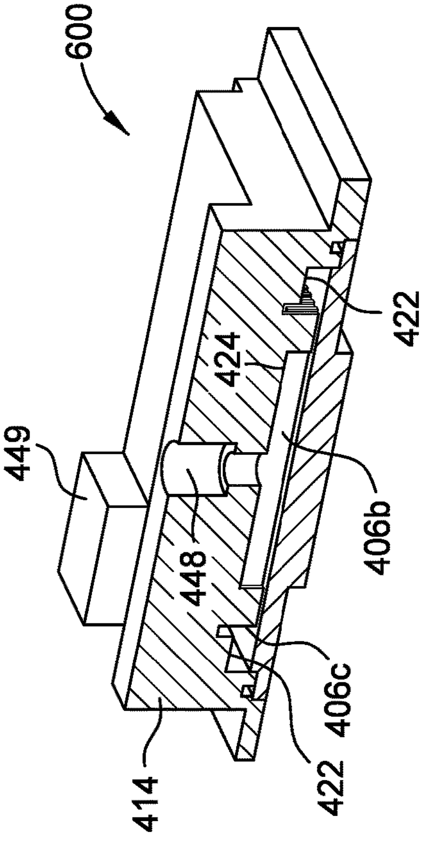
FIG. 7 illustrates a sectional view of an active cooling device equipped with another embodiment of surface area increasing structures.
Figure 7A:
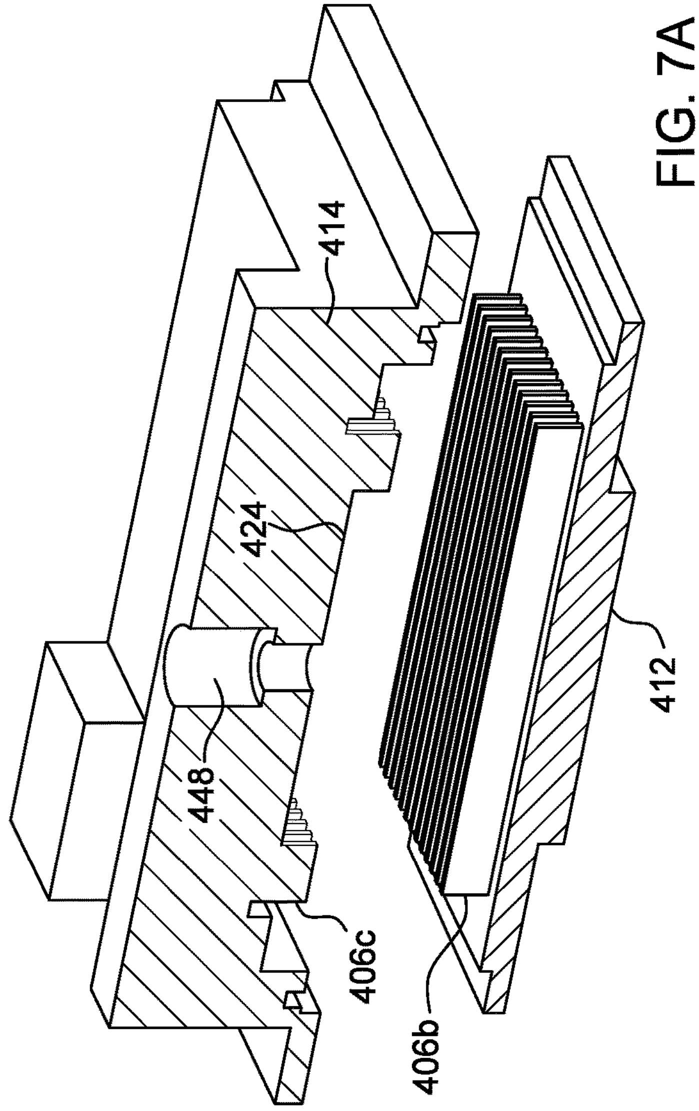
FIG. 7A shows the cap separated from the base of the active cooling device of FIG. 7.
Figure 7B:
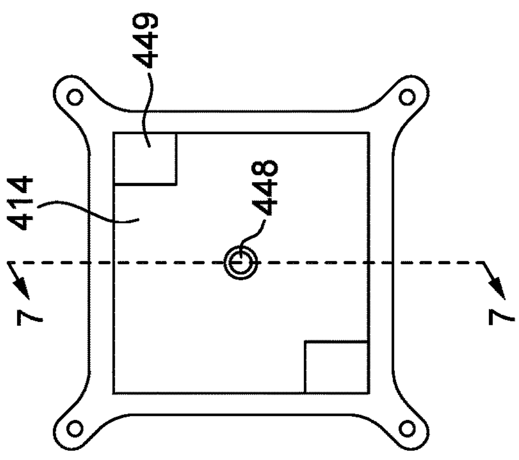
FIG. 7B is a schematic top view of the active cooling device of FIG. 7.

In some embodiments, the aperture may be in the shape of a notch formed in at least one of the cap fins **406*c* and the base fins 406*b* of the active cooling device 600. As shown in FIGS. 7 and 7A, a plurality of lower notches 424 are formed at the lower end of the cap fins 406*c*. In one example, the notches 424 may have a length from 0.2× to 0.85× the length of the cap fins 406*c* and a depth from 0.1× to 0.9× or 0.2× to 0.7× the height of the cap fins 406*c*. One or more notches 424 may be formed in all or some of the cap fins 406*c*. For example, the notches 424 may be formed in every other cap fin 406*c* or formed in the cap fins 406*c* located below or adjacent to the inlet port 414. In some embodiments, one or more of the cap fins 406*c* may include more than one notch 424. For example, two or more smaller sized notches 424 may be formed on a cap fin 406*c*. It is contemplated the notches may be formed in the base fins 406, alternatively or in addition, to the notches 424 in the cap fins 406*c***.

Figure 8:
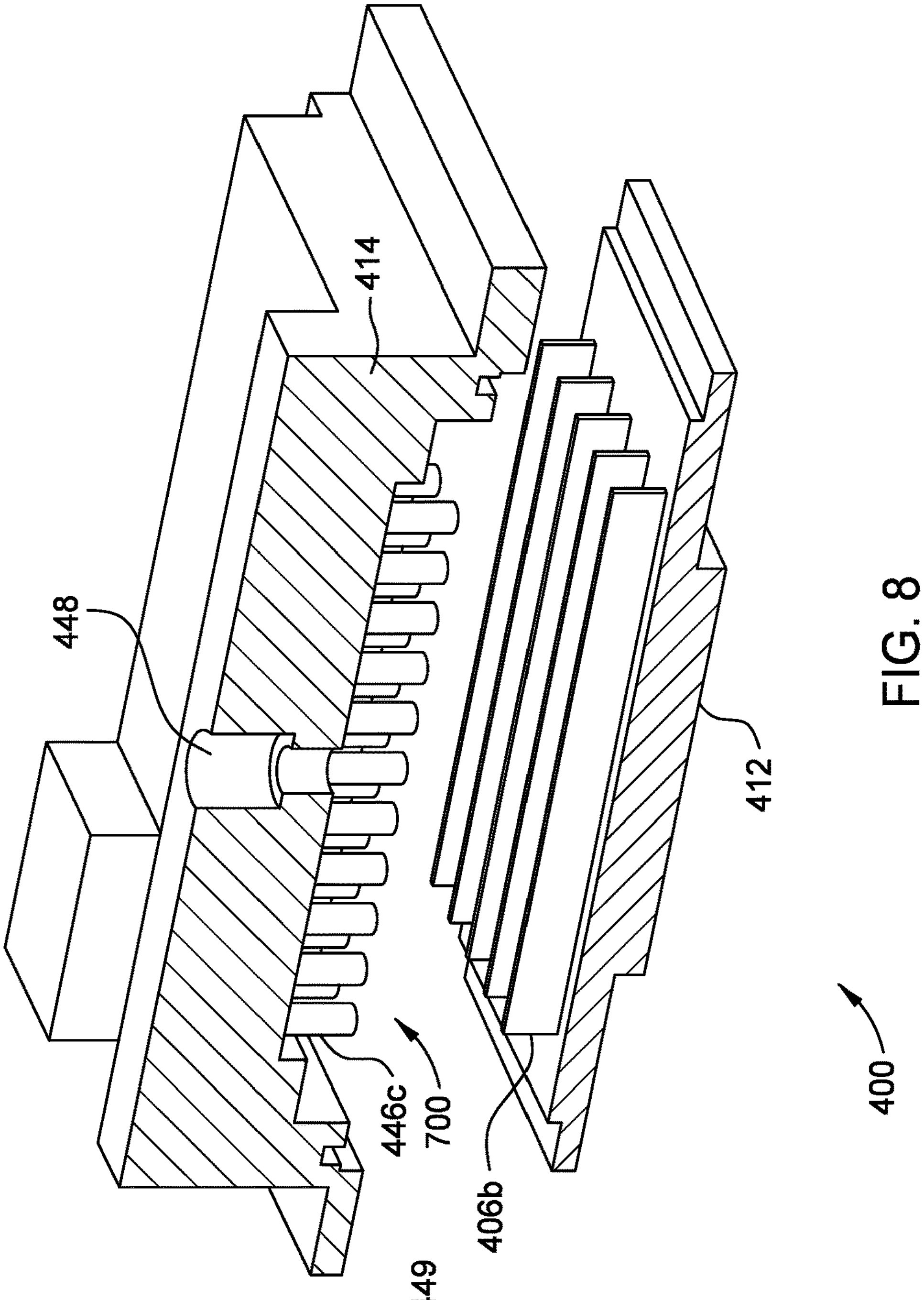
FIG. 8 illustrates a sectional view of an active cooling device equipped with another embodiment of surface area increasing structures.
Figure 8A:
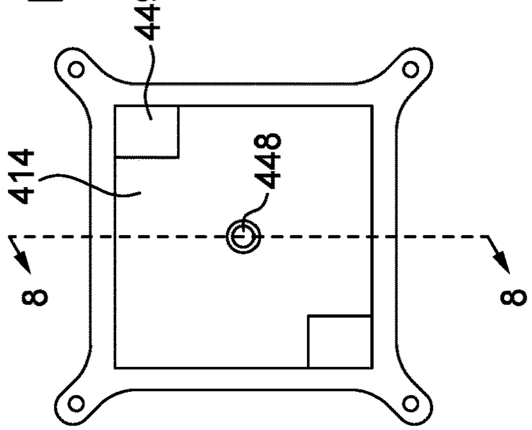
FIG. 8A is a schematic top view of the active cooling device of FIG. 8.
Figure 9:
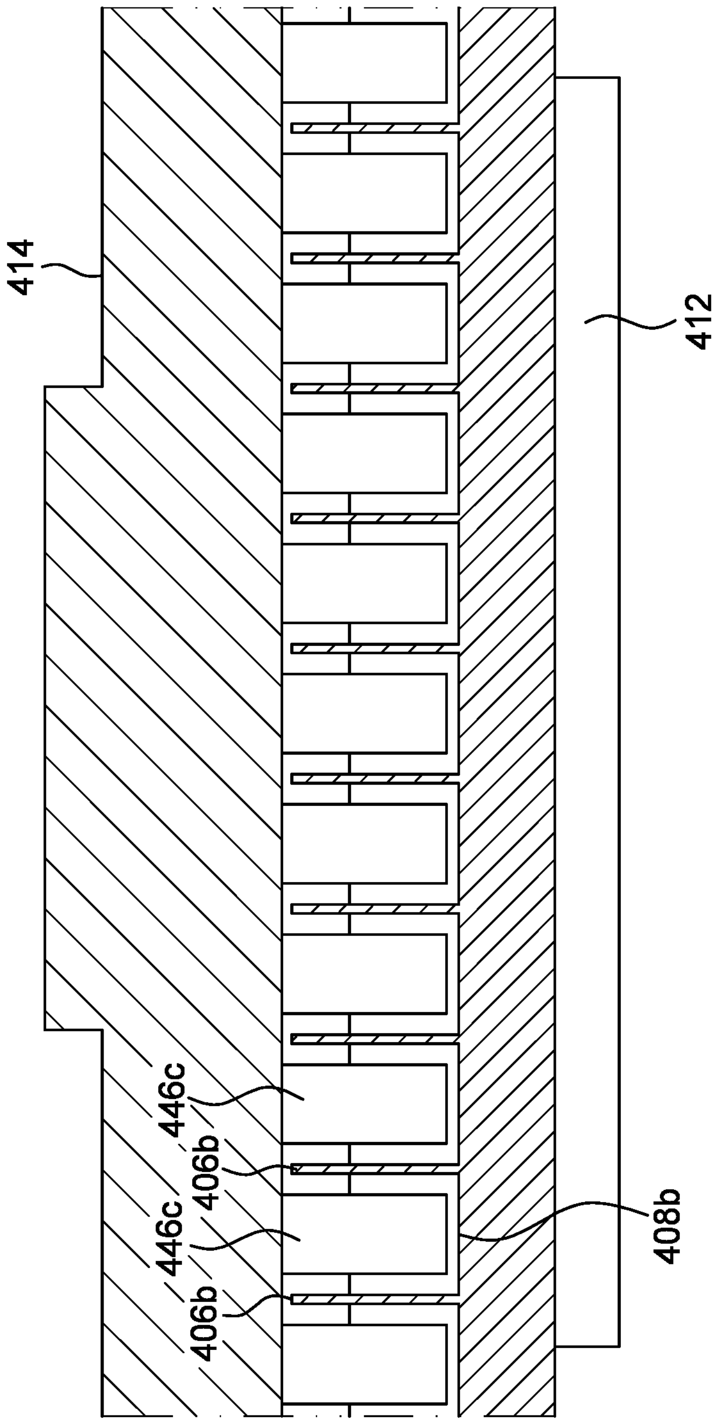
FIG. 9 illustrates an enlarged, partial sectional view of the active cooling device of FIG. 8, wherein the cap is disposed on the base.

In some embodiments, the cap 414 and the base 412 of the active cooling device are provided with different surface area increasing structures. FIG. 8 illustrates a sectional view of an active cooling device 700 equipped with another embodiment of surface area increasing structures. In FIG. 8, the cap 414 is separated from the base 412 of the active cooling device 700. FIG. 9 illustrates an enlarged, partial sectional view of the active cooling device 700 of FIG. 8, wherein the cap 414 is disposed on the base 412. In this embodiment, the base 412 includes a plurality of base fins **406*b* extending into the internal cavity 404 to define a plurality of base channels 408*b*. The cap 414 includes a plurality of cap pins 446*c* extending into the internal cavity 404. The cap pins 446*c* are arranged in columns that can be disposed in the base channels 408*b*** between two base fins 406*b*. Each column may have any suitable number of cap pins 446, such as from 5 to 25 cap pins 446*c* or from 5 to 15 cap pins 446*c*. The cap pins 446*c* may have any suitable shape, such as cylinder, cuboid, or prism. The cap pins 446*c* have a width that is smaller than the width between two base fins 406*b*. In one example, the cap pins 446*c* have a cylindrical shape having a diameter that is smaller than the width between two base fins 406*c*, as illustrated in FIG. 9. In this example, the cap pins 446*c* do not contact the base fins 406*b*. In some embodiments, an upper clearance is formed between the end of the base fin 406*b* and the cap 414. Optionally, a lower clearance is formed between the end of the cap pins 446*c* and the base 412. In some embodiments, the base fins 406*b* have a length from 10 mm to 100 mm or from 20 mm to 70 mm and a height from 2 mm to 10 mm or from 2 mm to 7 mm. The cap pins 446*c* have a height from 2 mm to 10 mm or from 2 mm to 7 mm and a diameter from 1 mm to 3 mm. In some embodiments, the base fins 406*b* and the cap pins 446*c* have the same height.

Figure 10:
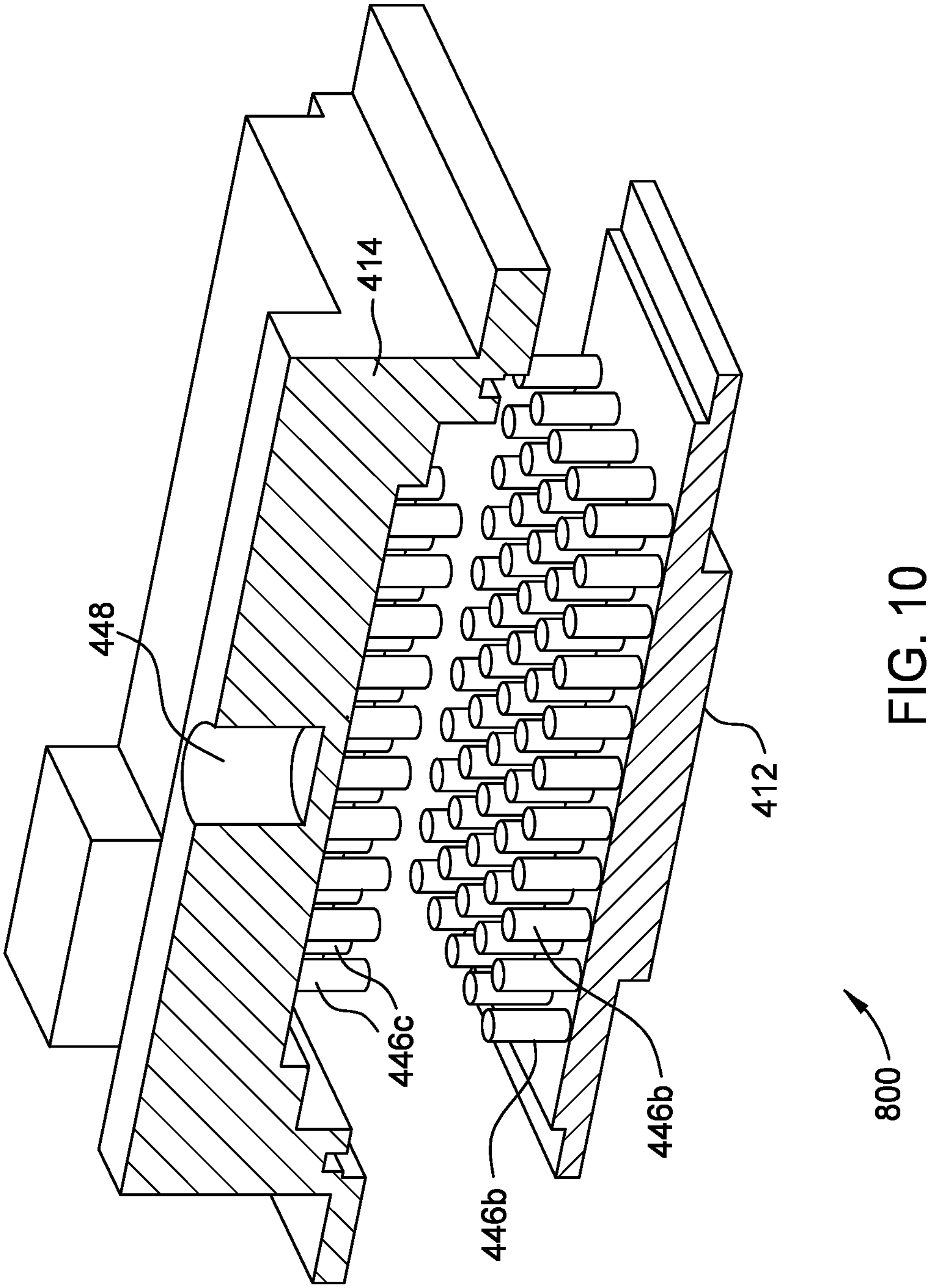
FIG. 10 illustrates a sectional view of an active cooling device equipped with another embodiment of surface area increasing structures.
Figure 11:
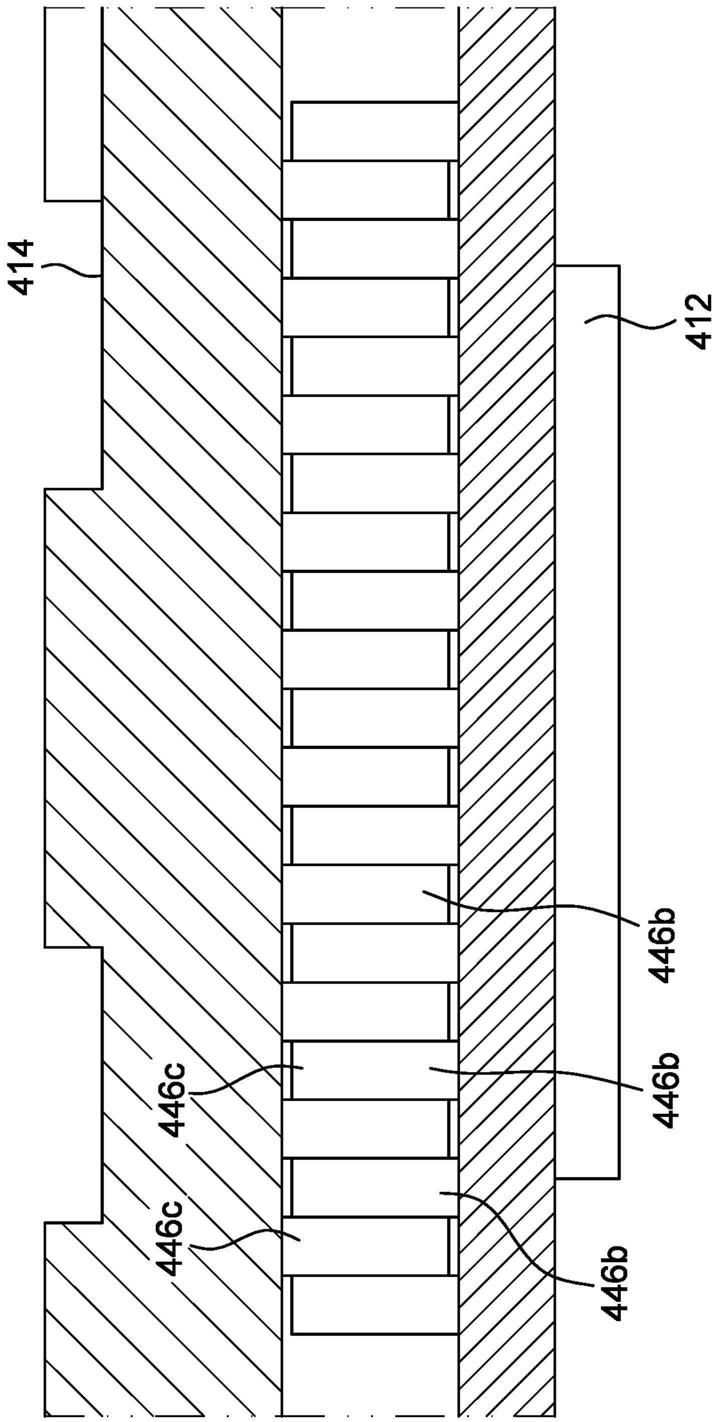
FIG. 11 illustrates an enlarged, partial sectional view of the active cooling device of FIG. 10, wherein the cap is disposed on the base.

FIG. 10 illustrates a sectional view of an active cooling device 800 equipped with another embodiment of surface area increasing structures. In FIG. 10, the cap 414 is separated from the base 412 of the active cooling device 800. FIG. 11 illustrates an enlarged, partial sectional view of the active cooling device of FIG. 10, wherein the cap 414 is disposed on the base 412. FIGS. 10 and 11 show each of the cap 414 and the base 412 is provided with cap pins 446*c*, 446*b* as its surface area increasing structures. In some embodiments, the base pins 446*b* extending from the base 412 are arranged in a plurality of base columns. The base pins 446*b* in each base column may be separated by any suitable distance. For example, the base pins 446*b* in the same base column may be separated by a distance that is less than, equal to, or more than their diameter size. Adjacent base columns may be separated by a distance that is less than, equal to, or more than the diameter size of the base pins 446*b*. In some embodiments, the base pins 446*b* of adjacent base columns may be arranged in a plurality of base rows. For example, the base pins 446*b* can be arranged in uniform base columns and base rows. In FIGS. 10 and 11, the base pins 446*b* in each base column and each base row are separated by a distance equaling to their diameter size. Each base column may have any suitable number of base pins 446*b*, such as from 5 to 25 base pins 446*b* or from 5 to 15 base pins 446*b*. The base pins 446*b* may have any suitable shape, such as cylinder, cuboid, or prism.

Similarly, the cap pins 446*c* are arranged in cap columns that can be disposed between adjacent base columns formed by the base pins 446*b*. The cap pins 446*c* in each cap column may be separated by any suitable distance. For example, the cap pins 446*c* in the same cap column may be separated by a distance that is less than, equal to, or more than their diameter size. Adjacent cap columns may be separated by a distance that is less than, equal to, or more than the diameter size of the cap pins 446*c*. In some embodiments, the cap pins 446*c* of adjacent cap columns may be arranged in a plurality of cap rows. For example, the cap pins 446*c* can be arranged in uniform cap columns and cap rows. In FIGS. 10 and 11, the cap pins 446*c* in each cap column and each cap row are separated by a distance equaling to their diameter size. Each cap column may have any suitable number of cap pins 446, such as from 5 to 25 cap pins 446*c* or from 5 to 15 cap pins 446*c*. The cap pins 446*c* may have any suitable shape, such as cylinder, cuboid, or prism. In some embodiments, the cap pins 446*c* may have the same or different shape as the base pins 446*b*. In some embodiments, the cap pins 446*c* may have the same or different diameter as the base pins 446*b*.

In the embodiment depicted in FIGS. 10 and 11, the cap pins 446*c* and the base pins 446*b* are arranged in uniform columns and rows, respectively, and have the same diameter size. When coupled, each cap column is disposed between two base columns, and each cap row is disposed between two base rows. In this example, the cap pins 446*c* do not contact the base pins 446*b*. In some embodiments, an upper clearance is formed between the end of the base pin 446*b* and the cap 414, and a lower clearance is formed between the end of the cap pins 446*c* and the base 412. In some embodiments, the cap pins 446*c* and base pins 446*b* may have a height from 2 mm to 10 mm or from 2 mm to 7 mm and a diameter from 1 mm to 3 mm. In some embodiments, the base pins 446*b* and the cap pins 446*c* have the same height.

Figure 12:
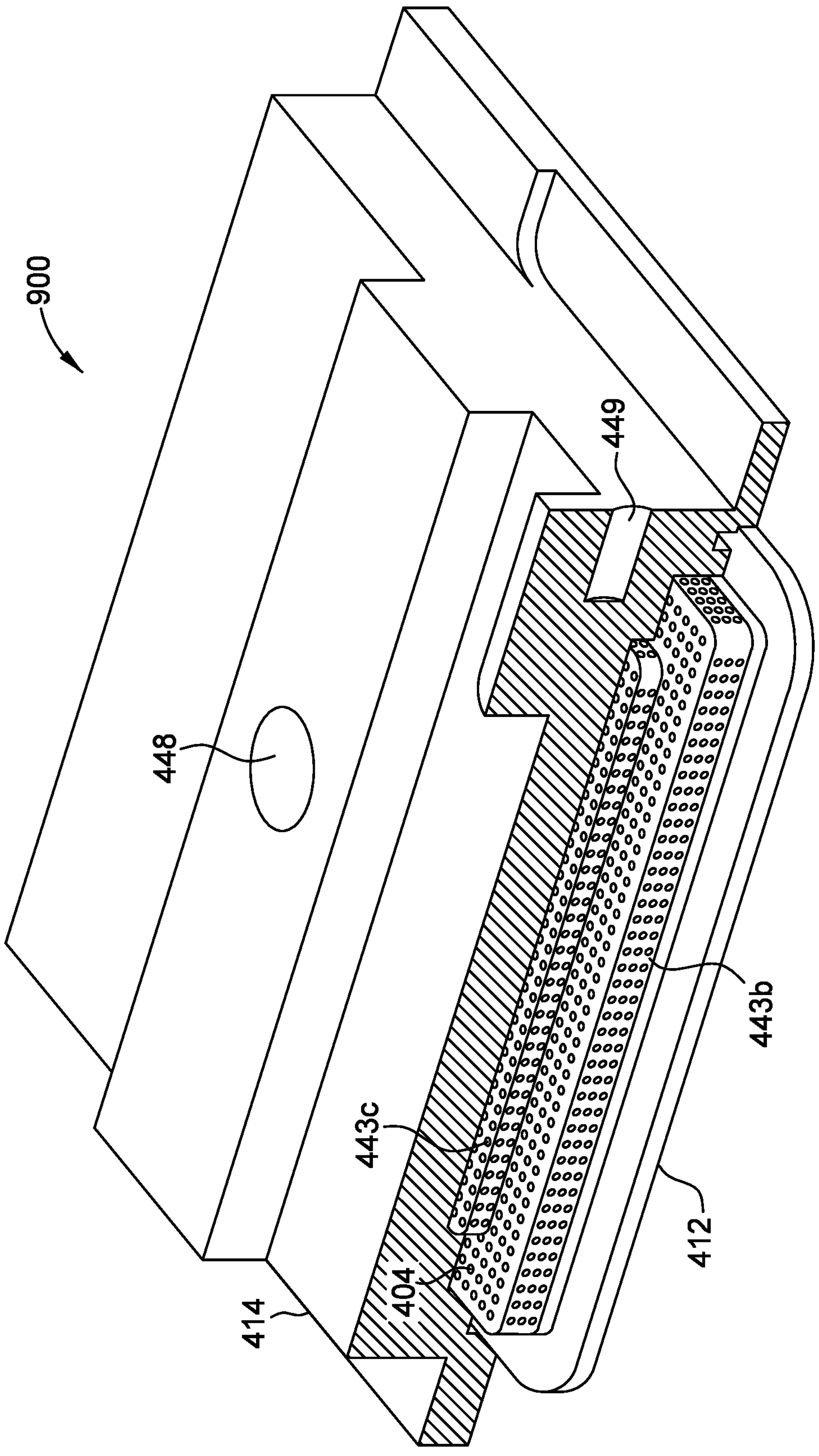
FIG. 12 illustrates a sectional view of an active cooling device equipped with another embodiment of surface area increasing structures.

FIG. 12 is a sectional view of another embodiment of the active cooling device 900. As shown, each of the cap 414 and the base 412 is provided with a porous metal material as its surface area increasing structures. In general, the porous metal structure are metal structures having pores that make up a large portion of its volume. As such, the base metal in the porous metal structure makes up a smaller portion of it volume, such as from 5% to 25% of the volume. For example, the porous metal structure can be a metal foam. Exemplary base metals suitable for fabricating a metal foam include copper and aluminum. In one embodiment, the cap 414 and base 412 are provided with one or more pieces of porous metal structure 443*c*, 443*b* sized to fit in and/or fill the internal cavity 404. For example, each of the cap 414 and base 412 is provided with a piece of porous metal structure 443*c*, 443*b* sized to fit in and/or fill the internal cavity 404. In another example, either the cap 414 or the base 412 is provided with a piece of porous metal structure sized to fit in the internal cavity 404.

Figure 13:
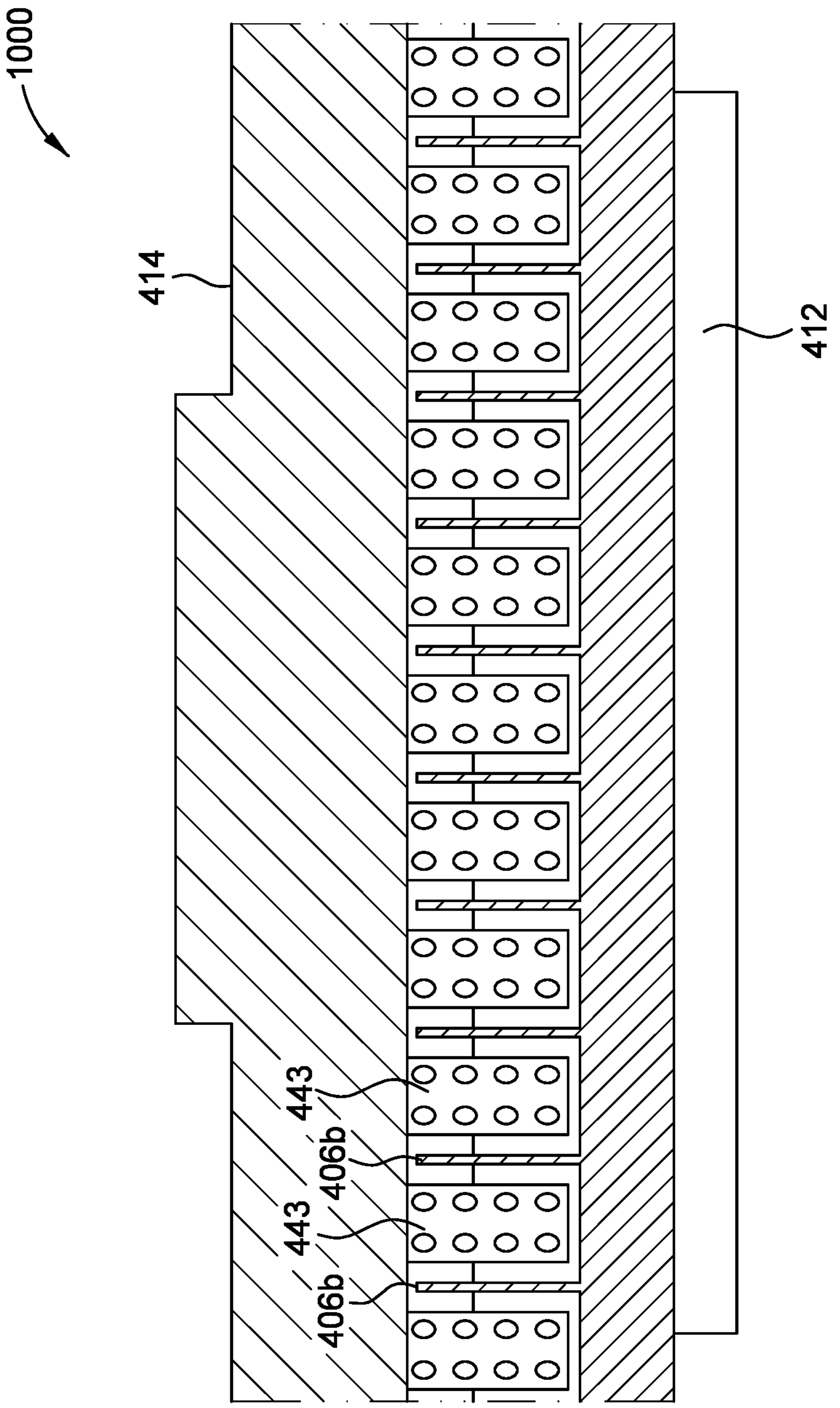
FIG. 13 is a sectional view of an active cooling device equipped with two different surface area increasing structures, according to some embodiments.

FIG. 13 is a sectional view of another embodiment of the active cooling device 1000 provided with two different surface area increasing structures. In this embodiment, the base 412 includes a plurality of base fins 406*b* extending into the internal cavity 404 to define a plurality of base channels 408*b*. A plurality of porous metal structures 443 are disposed in the base channels 408*b*. An exemplary porous metal structure is a metal foam. The porous metal structures 443 can be attached to the cap 414, the base 412, or both. In some embodiments, the porous metal structures 443 are sized to contact the cap 414 and the base 412. In some embodiments, a small clearance, such as less than 90% of the distance between the cap 414 and the base 412, may be formed between the porous metal structures 443 and the cap 414 or the base 412. As shown, a side clearance is formed between the porous metal structures 443 and an adjacent base fin 406*b*. It is contemplated the porous metal structures 443 may at least partially contact the adjacent base fins 406*b*. Although the porous metal structures 443 are shown as having a rectangular shape, the porous metal structures 443 may take on any suitable shape that is sized to fit in the base channels 408*b*. As shown, the upper end of the base fins 406*b* contacts the cap 414. In some embodiments, a small clearance, such as less than 90% of the distance between the cap 414 and the base 412, may be formed between base fin 406*b* and the cap 414. It is contemplated the cap 414 may be provided with fins, in addition to or alternatively to, the base 412 having base fins 412.

Figure 14:
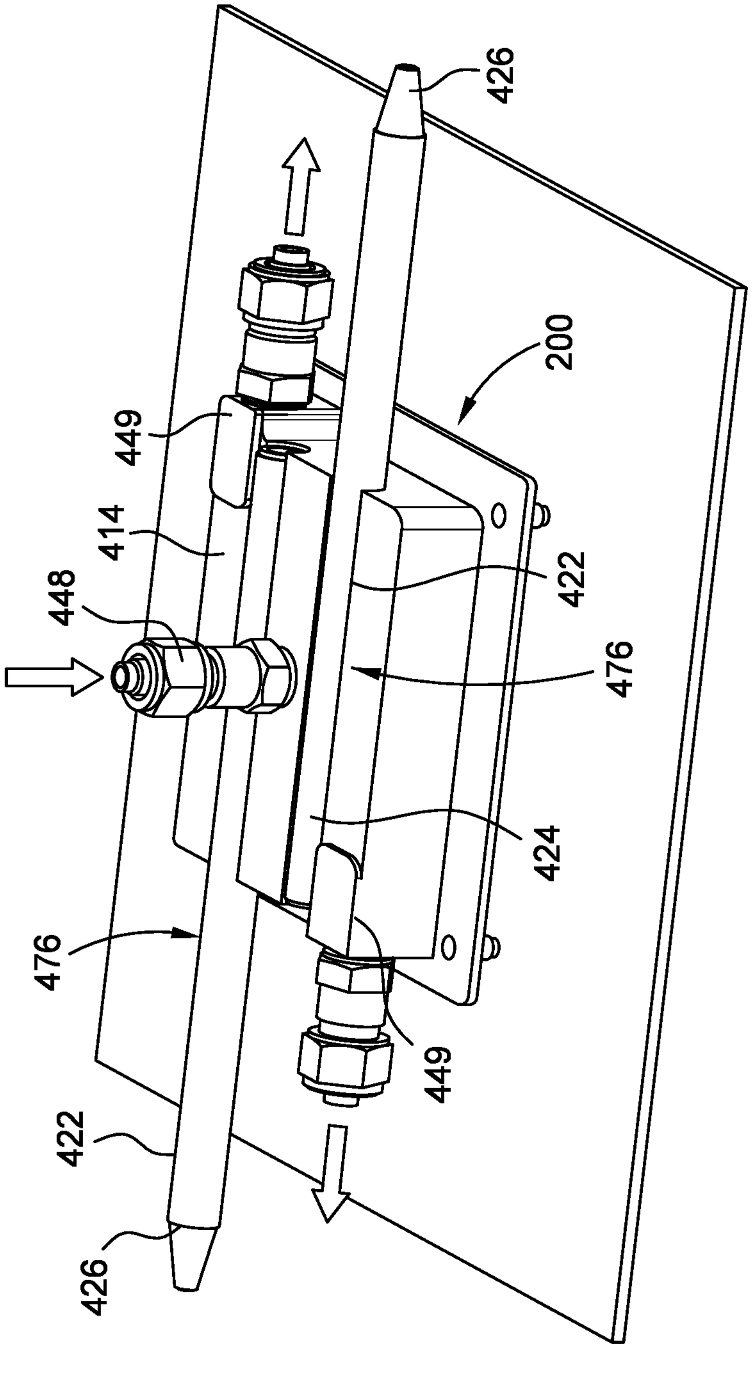
FIG. 14 illustrates an exemplary active cooling device having multiple flow ports equipped with passive cooling devices, according to some embodiments.

FIG. 14 illustrates an exemplary thermal management system 1100 having active cooling device equipped with multiple flow ports coupled to one or more passive cooling devices, according to some embodiments. As shown, the active cooling device 200 of FIG. 2 may be coupled to one or more passive cooling devices. The passive cooling device is illustrated in FIG. 14 as a heat pipe 476, or can be other suitable passive cooling device. In this embodiment, two heat pipes 476 are disposed on the cap 414, each of which is positioned between the inlet port 448 and an outlet port 449. The heat pipe 476 includes a sealed tube 422 having a sealed bore formed between a first end 424 and a second end 426. In one embodiment, the first end 424 is in contact with a thermally conductive solid surface, such as the active cooling device 200, to absorb heat from the dies 106. The second end 426 extends away from the thermally conductive surface to transfer heat away from the dies 106. The heat pipe 476 is flexible so it can be directed away from the dies 106 and toward a cold interface, such as another active cooling device or the heat plate 182. A phase change material is disposed in the sealed bore. An exemplary phase change material is gallium or alloys containing gallium.

In operation, the phase change material in a liquid phase is located in the first end 424 of the tube 422. The first end 424 is in contact with the active cooling device 200. The phase change material is turned into vapor by absorbing heat transferred from one of the dies 106. For example, the first end 424 of the tube 422 may receive heat transferred from the dies 106 via at least the active cooling device 200. The vapor (e.g., the phase change material) then travels from the first end 424 of the tube 422 inside the sealed bore to the cold interface at the second end 426 of the tube 422, and condenses back into a liquid, thereby releasing the latent heat. In some embodiments, the second end 426 is coupled to another active cooling device, to another chip package, or to the cooling plate 182 as shown in FIG. 1. The phase change material in liquid form then returns to the hot interface at the first end 424 of the tube 422 through capillary action and/or gravity, and the cycle repeats.

Figure 15:
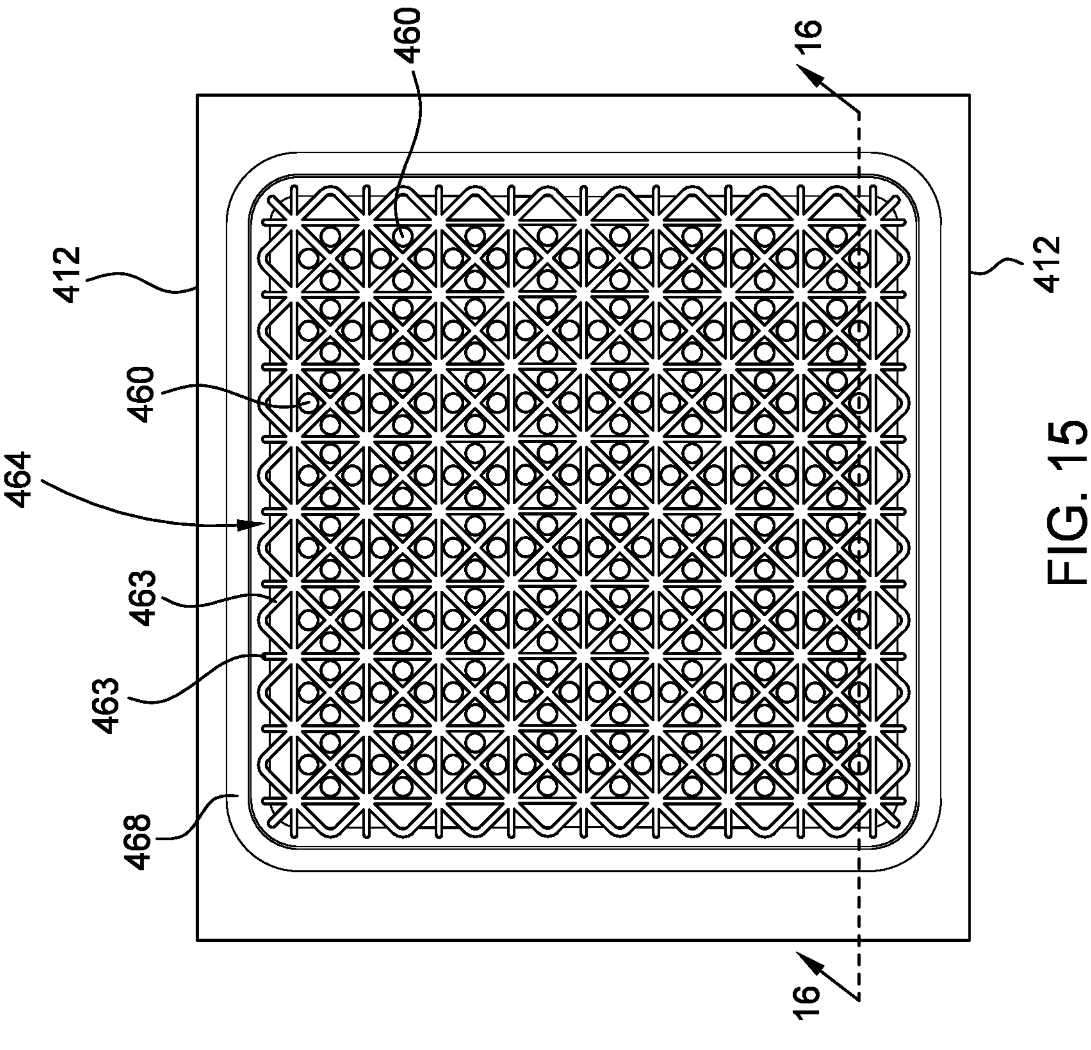
FIG. 15 is a partial view of a bottom surface of an active cooling device, according to some embodiments.
Figure 16:
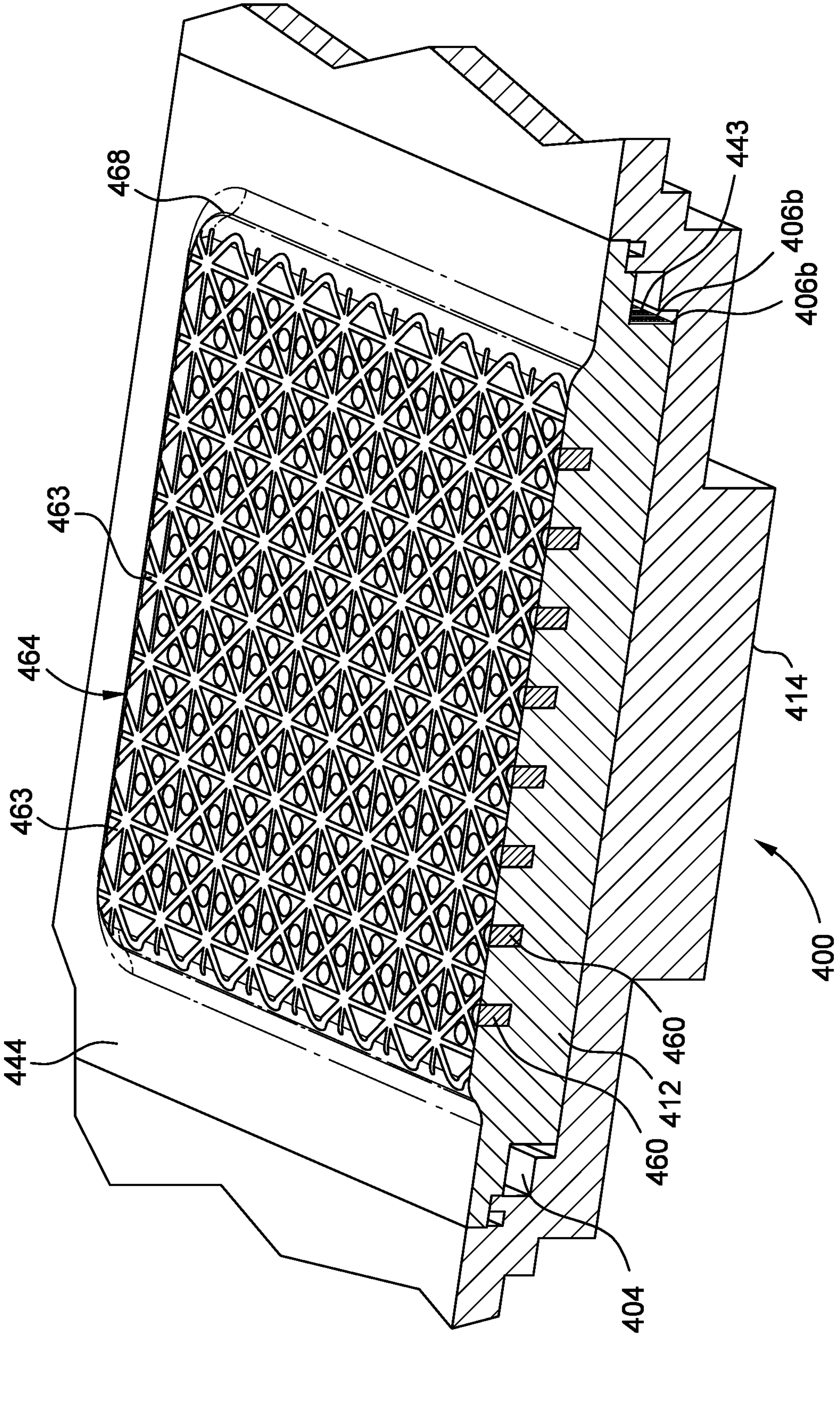
FIG. 16 is a cross-sectional view of the active cooling device of FIG. 15 taken along line 16-16.

In some embodiments, the base 412 of the active cooling device 400 may include a plurality of heat conductive particles. FIG. 15 is a partial view of the bottom surface 444 of the base 412 of the active cooling device 400. FIG. 16 is a cross-sectional view of the active cooling device 400 of FIG. 15 taken along line 16-16. As shown, the bottom surface 444 of the base 412 may include a patterned surface 464. In some embodiments, the bottom surface 444 may be the bottom surface 144 of the heat spreader 102 in FIG. 1. In some embodiments, the bottom surface 444 of the base 412 includes a pad 468 similar to the pad 152 of the heat spreader 102, and the patterned surface 464 is formed on the pad 468. The patterned surface 464 may include dimples, projections, blind holes, slots, channels and the like which increase the surface area of the bottom surface 444, thereby increasing the heat transfer efficiency. The patterned surface 464, in one example, is comprised of a pattern of micro-channels formed in the bottom surface 444. The patterned surface 464 may be formed in the bottom surface 444 via etching, embossing, or any other suitable technique. In some embodiments, a vapor chamber (e.g., vapor chamber 317) is formed in the pad 468 or the base 412.

In FIG. 15, the patterned surface 464 is in the form of micro-channels 463 arranged in rows, in columns, as positive-sloping diagonals, and as negative-sloping diagonals. A plurality of heat conductive particles 460 are embedded between the channels 463 in the pattern surface 464. An exemplary heat conductive particle 460 is diamond. In one example, the diamond is in the form of a cylinder. However, the heat conductive particle 460 may take on any suitable shape, such as cylinder, prism, and cuboid. Although the heat conductive particle 460 is shown embedded between each channel 463 in the patterned surface 464, the patterned surface 464 may include any suitable number of heat conductive particles 460, such as one or more heat conductive particles 460 disposed between every other channel. In some embodiments, the patterned surface 464 is optional to the bottom surface 444 embedded with the heat conductive particles 460.

It is contemplated that features described in one embodiment may be combined with features described in any other embodiment described herein. For example, the active cooling device 400 may include a plurality of surface area increasing structures and a plurality of heat conductive particles. As shown in FIG. 16, the active cooling device 400 described in FIG. 13 may be used with the heat conductive particles 460 described in FIGS. 15 and 16. The active cooling device 400 includes a plurality of base fins **406*b* and metal foams 443 disposed in the internal cavity 404 between the base 412 and the cap 414. Additionally, the base 412 may be embedded with the heat conductive particles 460 and optionally include a patterned surface 464**.

In one embodiment, a heat exchanger for a chip package is provided. The heat exchanger includes a body having an upper side, a lower side, and an internal cavity disposed in the body between the upper side and the lower side. A first outlet port and a second outlet port are formed in the body and are in fluid communication with the internal cavity. An inlet port is formed through the upper side of the body between the first and second outlet ports to supply fluid into the internal cavity. In some embodiments, the heat exchanger also includes a pad extending from the lower side of the body below the inlet port.

In some embodiments, the heat exchanger includes a pad extending from the lower side of the body below the inlet port, wherein the pad includes one or more grooves.

In some embodiments, the pad includes a plurality of diamonds.

In some embodiments, the heat exchanger includes a vapor chamber formed in the pad or the body.

In some embodiments, the heat exchanger includes surface area increasing structures that extend into the internal cavity.

In some embodiments, the surface area increasing structures extend into the internal cavity from the upper side, the lower side, or both.

In some embodiments, the surface area increasing structures comprise a plurality of fins.

In some embodiments, the plurality of fins include an aperture, a notch, or both.

In some embodiments, the surface area increasing structures further comprises a plurality of pins, a porous metal structure, or both.

In some embodiments, the plurality of fins include upper notches disposed below the inlet port.

In some embodiments, the surface area increasing structures comprise a porous metal structure, a plurality of pins, or both.

In some embodiments, the heat exchanger includes a heat pipe having one end in contact with the body and a second end extending away from the body.

A chip package includes a substrate, an integrated circuit ("IC") die mounted on the substrate, and a heat exchanger disposed over the IC die. The heat exchanger includes a body having an upper side, a lower side, and an internal cavity disposed in the body between the upper side and the lower side. The lower side faces a top surface of the IC die. The heat exchanger also includes a first outlet port and a second outlet port formed in the body, both of which are in fluid communication with the internal cavity. A first outlet port is formed in the body and in fluid communication with the internal cavity. The heat exchanger further includes a thermal interface material disposed between the lower side of the heat exchanger and the top surface of the IC die.

In some embodiments, the chip package includes surface area increasing structures that extend into the internal cavity.

In some embodiments, the surface area increasing structures extend into the internal cavity from the upper side, the lower side, or both.

In some embodiments, the surface area increasing structures comprise a plurality of fins, a plurality of pins, a porous metal structure, or combination thereof.

In some embodiments, the plurality of fins include an aperture, a notch, or both.

In some embodiments, the chip package includes a heat pipe having one end in contact with the body and a second end extending away from the body.

In some embodiments, the second end is in contact with one of a second heat exchanger, a cooling plate, or another chip package.

In some embodiments, the chip package includes a pad extending from the lower side toward the IC die.

In some embodiments, the pad includes a plurality of diamonds, one or more grooves, a vapor chamber, or combinations thereof.

While the foregoing is directed to embodiments of the present invention, other and further embodiments of the invention may be devised without departing from the basic scope thereof, and the scope thereof is determined by the claims that follow.

What is claimed is:

1. A heat exchanger for a chip package, the heat exchanger comprising:

a body having an upper side, a lower side, and an internal cavity disposed in the body between the upper side and the lower side;

surface area increasing structures extending from the body into the internal cavity;

an inlet port formed through a center region of the upper side of the body, the inlet port in fluid communication with the internal cavity:

a longitudinal groove disposed in the internal cavity and aligned with the inlet port;

a first flow gap defined in the internal cavity at a first end of the surface area increasing structures;

a second flow gap defined in the internal cavity at a second end of the surface area increasing structures;

a first outlet port formed in the body and in fluid communication with the first flow gap of the internal cavity, the first outlet port extending parallel with the longitudinal groove; and a second outlet port formed in the body and in fluid communication with the second flow gap of the internal cavity, the second outlet port extending parallel with the longitudinal groove.

2. The heat exchanger of claim 1 further comprising:

a pad extending from the lower side of the body below the inlet port and internal cavity, wherein the pad includes one or more external grooves.

3. The heat exchanger of claim 2, wherein the pad includes a plurality of diamonds.

4. The heat exchanger of claim 2, further comprising a vapor chamber formed in the pad or the body.

5. The heat exchanger of claim 1 wherein the surface area increasing structures that extend into the internal cavity are disposed between the first and second outlet ports.

6. The heat exchanger of claim 5, wherein the surface area increasing structures extend into the internal cavity from the upper side, the lower side, or both.

7. The heat exchanger of claim 5, wherein the surface area increasing structures comprise a plurality of fins extending in a direction that is transverse to a direction of the first and second outlet ports.

8. The heat exchanger of claim 7, wherein the plurality of fins include an aperture, a notch, or both.

9. The heat exchanger of claim 7, wherein the surface area increasing structures further comprises a plurality of pins, a porous metal structure, or both.

10. The heat exchanger of claim 7, wherein a portion of the longitudinal groove includes upper notches formed in the plurality of fins disposed below the inlet port.

11. The heat exchanger of claim 5, wherein the surface area increasing structures comprise a porous metal structure, a plurality of pins, or both.

12. The heat exchanger of claim 1, further comprising a heat pipe having one end in contact with the body and a second end extending away from the body.

13. A chip package comprising:

a substrate;

an integrated circuit ("IC") die mounted on the substrate;

a heat exchanger comprising:

a body having an upper side, a lower side, and an internal cavity disposed in the body between the upper side and the lower side, the lower side facing a top surface of the IC die;

a plurality of fins extending from the body into the internal cavity;

an inlet port formed through a center region the upper side of the body in fluid communication with the internal cavity:

a longitudinal groove disposed in the internal cavity and aligned with the inlet port;

a first flow gap defined in the internal cavity at a first end of the plurality of fins;

a second flow gap defined in the internal cavity at a second end of the plurality of fins;

a first outlet port formed in the body and in fluid communication with the first flow gap of the internal cavity, the first outlet port extending parallel with the longitudinal groove; and a second outlet port formed in the body and in fluid communication with the second flow gap of the internal cavity, the second outlet port extending parallel with the longitudinal groove; and a thermal interface material disposed between the lower side of the heat exchanger and the top surface of the IC die.

14. The chip package of claim 13, wherein the plurality of fins extend between the first flow gap and the second flow gap in a direction transverse to a direction of the first and second outlet ports.

15. The chip package of claim 14, wherein the plurality of fins extend into the internal cavity from the upper side, the lower side, or both.

16. The chip package of claim 14, wherein at least some of the plurality of fins have a slot formed therethrough.

17. The chip package of claim 13, wherein the plurality of fins include an aperture, a notch, or both.

18. The chip package of claim 13, further comprising a heat pipe having one end in contact with the body and a second end extending away from the body.

19. The chip package of claim 18, wherein the second end is in contact with one of a second heat exchanger, a cooling plate, or another chip package.

20. The chip package of claim 13, wherein the body of the heat exchanger further comprising an exterior pad extending from the lower side of the body toward the IC die.

* * * * *